US012075634B2

(12) United States Patent
Yang et al.

(10) Patent No.: US 12,075,634 B2
(45) Date of Patent: *Aug. 27, 2024

(54) RRAM MEMORY CELL WITH MULTIPLE FILAMENTS

(71) Applicant: Taiwan Semiconductor Manufacturing Company, Ltd., Hsin-Chu (TW)

(72) Inventors: Chin-Chieh Yang, New Taipei (TW); Chih-Yang Chang, Yuanlin Township (TW); Wen-Ting Chu, Kaohsiung (TW); Yu-Wen Liao, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/347,794

(22) Filed: Jul. 6, 2023

(65) Prior Publication Data

US 2023/0354618 A1 Nov. 2, 2023

Related U.S. Application Data

(60) Continuation of application No. 17/542,638, filed on Dec. 6, 2021, now Pat. No. 11,737,290, which is a
(Continued)

(51) Int. Cl.
*H10B 63/00* (2023.01)
*G11C 13/00* (2006.01)
(Continued)

(52) U.S. Cl.
CPC .......... *H10B 63/82* (2023.02); *G11C 13/0011* (2013.01); *G11C 13/0069* (2013.01);
(Continued)

(58) Field of Classification Search
CPC ........ H10B 63/82; H10B 63/30; H10B 63/80; H10B 63/84; H10B 63/32; G11C 13/0011;
(Continued)

(56) References Cited

U.S. PATENT DOCUMENTS 10,109,793 B2 10/2018 Yang et al.
10,504,963 B2 * 12/2019 Yang .................... H10N 70/063
(Continued)

OTHER PUBLICATIONS

Non-Final Office Action dated Feb. 15, 2019 for U.S. Appl. No. 15/904,963.
(Continued)

*Primary Examiner* — Patricia D Valenzuela
(74) *Attorney, Agent, or Firm* — Eschweiler & Potashnik, LLC

(57) ABSTRACT

The present disclosure, in some embodiments, relates to an integrated chip. The integrated chip includes a first resistive random access memory (RRAM) element and a second RRAM element over a substrate. A conductive element is arranged below the first RRAM element and the second RRAM element. The conductive element electrically couples the first RRAM element to the second RRAM element. An upper insulating layer continuously extends over the first RRAM element and the second RRAM element. An upper inter-level dielectric (ILD) structure laterally surrounds the first RRAM element and the second RRAM element. The upper insulating layer separates the first RRAM element and the second RRAM element from the upper ILD structure.

20 Claims, 11 Drawing Sheets

Related U.S. Application Data continuation of application No. 16/587,693, filed on Sep. 30, 2019, now Pat. No. 11,201,190, which is a continuation of application No. 16/202,576, filed on Nov. 28, 2018, now Pat. No. 10,680,038, which is a division of application No. 15/904,963, filed on Feb. 26, 2018, now Pat. No. 10,504,963.

(60) Provisional application No. 62/552,078, filed on Aug. 30, 2017.

(51) Int. Cl.
| | | |
|---|---|---|
| *H10N 70/00* | (2023.01) | |
| *H10N 70/20* | (2023.01) | |
| *H01L 23/522* | (2006.01) | |
| *H01L 23/528* | (2006.01) | |
| *H01L 27/10* | (2006.01) | |

(52) U.S. Cl.
CPC ............ *H10B 63/30* (2023.02); *H10B 63/80* (2023.02); *H10N 70/063* (2023.02); *H10N 70/20* (2023.02); *H10N 70/24* (2023.02); *H10N 70/826* (2023.02); *H10N 70/841* (2023.02); *H10N 70/8833* (2023.02); *H10N 70/8836* (2023.02); *G11C 13/0002* (2013.01); *G11C 13/0023* (2013.01); *G11C 13/004* (2013.01); *G11C 2213/79* (2013.01); *H01L 23/5226* (2013.01); *H01L 23/5283* (2013.01); *H01L 27/101* (2013.01); *H10B 63/32* (2023.02); *H10B 63/84* (2023.02); *H10N 70/011* (2023.02); *H10N 70/023* (2023.02); *H10N 70/821* (2023.02); *H10N 70/8845* (2023.02)

(58) Field of Classification Search
CPC ............ G11C 13/0069; G11C 13/0023; G11C 13/004; G11C 2213/79; G11C 2213/78; G11C 2213/82; G11C 13/003; G11C 13/0007; G11C 13/0021; G11C 13/0002; H10N 70/063; H10N 70/20; H10N 70/24; H10N 70/826; H10N 70/841; H10N 70/8833; H10N 70/8836; H10N 70/011; H10N 70/023; H10N 70/821; H10N 70/8845; H10N 70/801; H01L 23/5226; H01L 23/5283; H01L 27/101

See application file for complete search history.

(56) References Cited

U.S. PATENT DOCUMENTS

| | | |
|---|---|---|
| 11,201,190 B2 | 12/2021 | Yang et al. |
| 2003/0198080 A1 | 10/2003 | Iwata |
| 2007/0215852 A1 | 9/2007 | Lung |
| 2008/0304308 A1 | 12/2008 | Stipe |
| 2011/0001108 A1 | 1/2011 | Greene et al. |
| 2011/0220861 A1 | 9/2011 | Himeno et al. |
| 2013/0051114 A1 | 2/2013 | Kim et al. |
| 2013/0221316 A1 | 8/2013 | Greene et al. |
| 2014/0021584 A1 | 1/2014 | Tu et al. |
| 2015/0295172 A1* | 10/2015 | Sung .................... H10N 70/826 257/2 |
| 2015/0349086 A1 | 12/2015 | Ting et al. |
| 2019/0088874 A1 | 3/2019 | Shum et al. |

OTHER PUBLICATIONS

Notice of Allowance dated Aug. 12, 2019 for U.S. Appl. No. 15/904,963.

Non-Final Office Action dated Sep. 19, 2019 for U.S. Appl. No. 16/202,576.

Notice of Allowance dated Feb. 5, 2020 for U.S. Appl. No. 16/202,576.

Non-Final Office Action dated Sep. 29, 2020 for U.S. Appl. No. 16/587,693.

Non-Final Office Action dated Mar. 1, 2021 for U.S. Appl. No. 16/587,693.

Notice of Allowance dated Aug. 6, 2021 for U.S. Appl. No. 16/587,693.

Non-Final Office Action dated Nov. 10, 2022 for U.S. Appl. No. 17/542,638.

Notice of Allowance dated Apr. 13, 2023 for U.S. Appl. No. 17/542,638.

* cited by examiner

| | wordline | | bitline 1 | | bitline 2 | | selectline | | |
|---|---|---|---|---|---|---|---|---|---|
| | sel. | unsel. | sel. | unsel. | sel. | unsel. | sel. | unsel. | |
| Forming 1 | 0.8~1.4 V | 0 V | 2.8V~3.6V | 0 V | 0 V | 0 V | 0 V | 0 V | ← 804 |
| Forming 2 | 0.8~1.4 V | 0 V | 0 V | 0 V | 2.8V~3.6V | 0 V | 0 V | 0 V | ← 806 |
| Set | 1.6~2.4 V | 0 V | 1.6V~2.0V | 0 V | 1.6V~2.0V | 0 V | 0 V | 0 V | ← 808 |
| Reset | 1.8~3.0 V | 0 V | 0 V | 0 V | 0 V | 0 V | 1.6V~2.0V | 0 V | ← 810 |
| Read | 0.9~1.3 V | 0 V | 0 V | 0 V | 0 V | 0 V | 0.2~0.4V | 0 V | ← 812 |

RRAM MEMORY CELL WITH MULTIPLE FILAMENTS

REFERENCE TO RELATED APPLICATIONS

This Application is a Continuation of U.S. application Ser. No. 17/542,638, filed on Dec. 6, 2021, which is a Continuation of U.S. application Ser. No. 16/587,693, filed on Sep. 30, 2019 (now U.S. Pat. No. 11,201,190, issued on Dec. 14, 2021), which is a Continuation of U.S. application Ser. No. 16/202,576, filed on Nov. 28, 2018 (now U.S. Pat. No. 10,680,038, issued on Jun. 9, 2020), which is a Divisional of U.S. application Ser. No. 15/904,963, filed on Feb. 26, 2018 (now U.S. Pat. No. 10,504,963, issued on Dec. 10, 2019), which claims the benefit of U.S. Provisional Application No. 62/552,078, filed on Aug. 30, 2017. The contents of the above-referenced Patent Applications are hereby incorporated by reference in their entirety.

BACKGROUND

Many modern day electronic devices contain electronic memory configured to store data. Electronic memory may be volatile memory or non-volatile memory. Volatile memory stores data when it is powered, while non-volatile memory (NVM) is able to store data when power is removed. Resistive random access memory (RRAM) is one promising candidate for a next generation of non-volatile memory due to its simple structure and its compatibility with CMOS logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
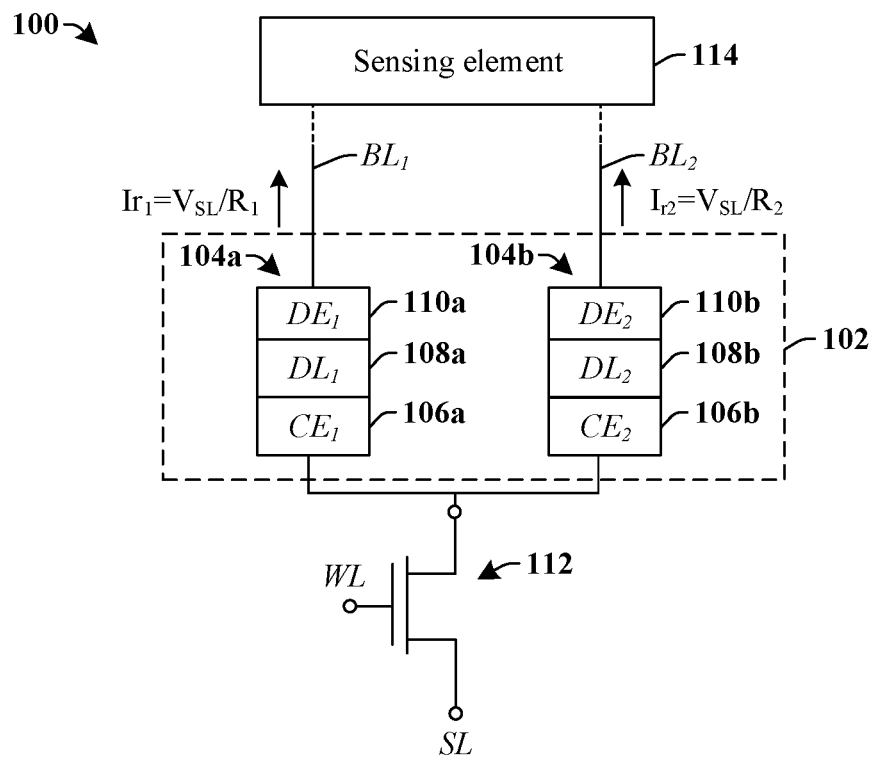
FIG. 1 illustrates a schematic diagram of some embodiments of a memory circuit having an RRAM (resistive random access memory) cell with multiple RRAM elements.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A resistive random access memory (RRAM) cell typically comprises a layer of high-k dielectric material arranged between conductive electrodes disposed within a back-end-of-the-line (BEOL) stack. The RRAM cell is configured to operate based upon a process of reversible switching between resistive states. This reversible switching is enabled by selectively forming a conductive filament through the layer of high-k dielectric material. For example, the layer of high-k dielectric material, which is normally insulating, can be made to conduct by applying a voltage across the conductive electrodes to form a conductive filament extending through the layer of high-k dielectric material. A layer of high-k dielectric material having a first (e.g., high) resistance corresponds to a first data state (e.g., a logical '0') and a layer of high-k dielectric material having a second (e.g., low) resistance corresponds to a second data state (e.g., a logical '1').

The resistance of the layer of high-k dielectric material is based on a size of the conductive filament. For example, a conductive filament having a first size (e.g., width) will provide the RRAM cell with a different resistance than a conductive filament having a different, second size. The size of a conductive filament may be based on a voltage and/or current used to form an initial conductive filament within the layer of high-k dielectric material. However, because the voltage and/or current used to form the initial conductive filament is limited, the filament provides for a limited decrease in a resistance of the RRAM cell that can lead to degradation in performance. For example, a limited decrease in resistance results in an RRAM cell having highly resistive data states that limit a current that can be used to read the RRAM cell. Limiting the current that can be used to read the RRAM cell results in a small difference in read currents (i.e., a read current window) between a first data state (e.g., a '0') and a second data state (e.g., a '1'). The small difference in read currents makes it difficult to accurately read data states from an RRAM cell.

The present disclosure, in various embodiments, relates to a memory circuit having an RRAM cell comprising multiple RRAM elements respectively configured to form a conductive filament. The memory circuit has a first RRAM element that is arranged within a dielectric structure over a substrate and that has a first conjunct electrode separated from a first disjunct electrode by a first data storage layer. A second RRAM element is arranged within the dielectric structure and has a second conjunct electrode separated from a second disjunct electrode by a second data storage layer. The first conjunct electrode is electrically coupled to the second conjunct electrode. Electrically coupling the first and second RRAM elements allows for read currents describing a single data state to be generated by both the first and second RRAM elements. By combining the read currents to describe the single data state, an overall read current of the memory cell is increased and performance degradation due to a limited resistance of a single conductive filament is mitigated.

FIG. 1 illustrates a schematic diagram of some embodiments of a memory circuit 100 having a resistive random access memory (RRAM) cell comprising multiple RRAM elements.

The memory circuit 100 comprises an RRAM cell 102 configured to store a single data state (e.g., a logical '0' or '1') using separate RRAM elements 104a-104b coupled to a control device 112. The RRAM cell 102 includes a first RRAM element 104a and a second RRAM element 104b. The first RRAM element 104a is coupled between a first terminal of the control device 112 and a first bit-line BL$_1$ and the second RRAM element 104b is coupled between the first terminal of the control device 112 and a second bit-line BL$_2$. The control device 112 further comprises a second terminal coupled to a source-line SL and a third terminal coupled to a word-line WL. In some additional embodiments, the RRAM cell 102 may have one or more additional RRAM elements (e.g., so that the RRAM cell 102 has three or more RRAM elements), which are connected between the first terminal of the control device 112 and one or more additional bit-lines.

The first RRAM element 104a includes a first conjunct electrode 106a coupled to the first terminal of the control device 112 and a first disjunct electrode 110a coupled to the first bit-line BL$_1$. The first conjunct electrode 106a is separated from the first disjunct electrode 110a by way of a first data storage layer 108a. The second RRAM element 104b includes a second conjunct electrode 106b coupled to the first terminal of the control device 112 and a second disjunct electrode 110b coupled to the second bit-line BL$_2$. The second conjunct electrode 106b is separated from the second disjunct electrode 110b by way of a second data storage layer 108b. The first bit-line BL/and the second bit-line BL$_2$ are further coupled to a sensing element 114 (e.g., a sense amplifier) configured to read a single data state (i.e., a single data bit) of the RRAM cell 102 from the first bit-line BL/and the second bit-line BL$_2$.

During operation, a conductive filament is respectively formed within each of the separate RRAM elements 104a-104b, so that the RRAM cell 102 comprises multiple conductive filaments. For example, a first conductive filament is formed in the first data storage layer 108a and a second conductive filament is formed within the second data storage layer 108b. Since the first RRAM element 104a and the second RRAM element 104b are both connected to the control device 112, the first RRAM element 104a and the second RRAM element 104b are able to generate separate read currents, during a read operation, which collectively describe the single data state stored in the RRAM cell 102.

For example, a voltage Vs', applied to the source-line SL will cause the first RRAM element 104a and the second RRAM element 104b to generate separate read currents, $I_{r1}$ and $I_{r2}$, that are respectively proportional to the voltage Vs', (e.g., $I_{rn}=V_{SL}/R_n$, wherein $R_n$ is the resistance of the first RRAM element 104a or the second RRAM element 104b). The separate read currents, $I_{r1}$ and $I_{r2}$, respectively describe a data state of the RRAM cell 102, so that a collective read current output from the RRAM cell 102 is equal to approximately twice the read current (i.e., $2V_{SL}/R_1$) produced by the first RRAM element 104a or the second RRAM element 104b. Therefore, the RRAM cell 102 is configured to generate a collective read current that is larger than the separate read currents to give the RRAM cell 102 an improved read current window.

Figure 2:
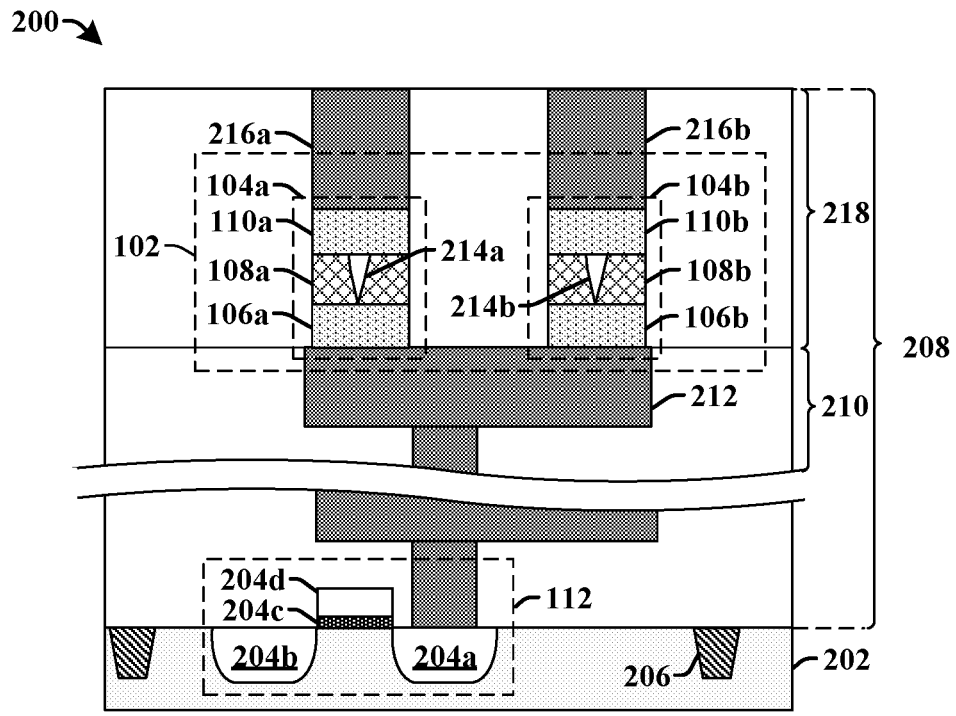
FIG. 2 illustrates a cross-sectional view of some embodiments of an integrated chip comprising a memory circuit having an RRAM cell with multiple RRAM elements respectively configured to form a conductive filament.

FIG. 2 illustrates a cross-sectional view of some embodiments of a memory circuit 200 having an RRAM cell comprising multiple RRAM elements.

The memory circuit 200 comprises a control device 112 arranged within a substrate 202. In various embodiments, the control device 112 may comprise a MOSFET, a bi-polar junction transistor (BJT), a high electron mobility transistor (HEMT), or a similar device. The control device 112 has a first terminal, a second terminal, and a third terminal. In some embodiments, wherein the control device 112 comprises a MOSFET, the first terminal may comprise a drain region 204a, the second terminal may comprise a source region 204b, and the third terminal may comprise a gate electrode 204d separated from the substrate 202 by a gate dielectric 204c. In some embodiments, the control device 112 may be disposed between isolation regions 206 (e.g., shallow trench isolation regions) within the substrate 202.

A dielectric structure 208 is over the substrate 202. In some embodiments, the dielectric structure 208 comprises a lower inter-level dielectric (ILD) layer 210 and an upper ILD layer 218 over the lower ILD layer 210. The lower ILD layer 210 surrounds a lower interconnect layer 212 underlying an RRAM cell 102 surrounded by the upper ILD layer 218. In some embodiments, the lower interconnect layer 212 may comprise a metal wire separated from the substrate 202 by way of one or more additional lower interconnect layers comprising conductive wires, conductive vias, and/or conductive contacts. In such embodiments, a via contacts a bottom of the metal wire at a location set back from outer edges of the metal wire. In some embodiments, the lower interconnect layer 212 may comprise copper, tungsten, aluminum, or the like.

The RRAM cell 102 comprises a first RRAM element 104a and a second RRAM element 104b. The first RRAM element 104a includes a first conjunct electrode 106a separated from a first disjunct electrode 110a by way of a first data storage layer 108a. The first disjunct electrode 110a is further coupled to a first upper via 216a. The second RRAM element 104b includes a second conjunct electrode 106b that is separated from a second disjunct electrode 110b by way of a second data storage layer 108b. The second disjunct electrode 110b is further coupled to a second upper via 216b. The first data storage layer 108a is separated from the second data storage layer 108b by a non-zero distance. In some embodiments, the first upper via 216a and the second upper via 216b may comprise copper, tungsten, aluminum, or the like.

The lower interconnect layer 212 is configured to electrically connect the first conjunct electrode 106a of the first RRAM element 104a and the second conjunct electrode 106b of the second RRAM element 104b. In some embodiments, the lower interconnect layer 212 may continuously extend from directly below the first RRAM element 104a to directly below the second RRAM element 104b.

During operation, a first conductive filament 214a may be selectively formed within the first data storage layer 108a and a second conductive filament 214b may be selectively formed within the second data storage layer 108b. The first conductive filament 214a causes the first data storage layer 108a to have a resistance that defines a data state (e.g., a logical '1') of the RRAM cell 102. Similarly, the second conductive filament 214b causes the second data storage layer 108b to have a resistance that also defines the same data state (e.g., a logical '1') of the RRAM cell 102. Because the first RRAM element 104a and the second RRAM element 104b are connected by the lower interconnect layer 212, the first RRAM element 104a and the second RRAM element 104b are able to output separate read currents that collectively describe the data state stored in the RRAM cell 102, thereby giving the RRAM cell 102 an improved read current window.

Figure 3:
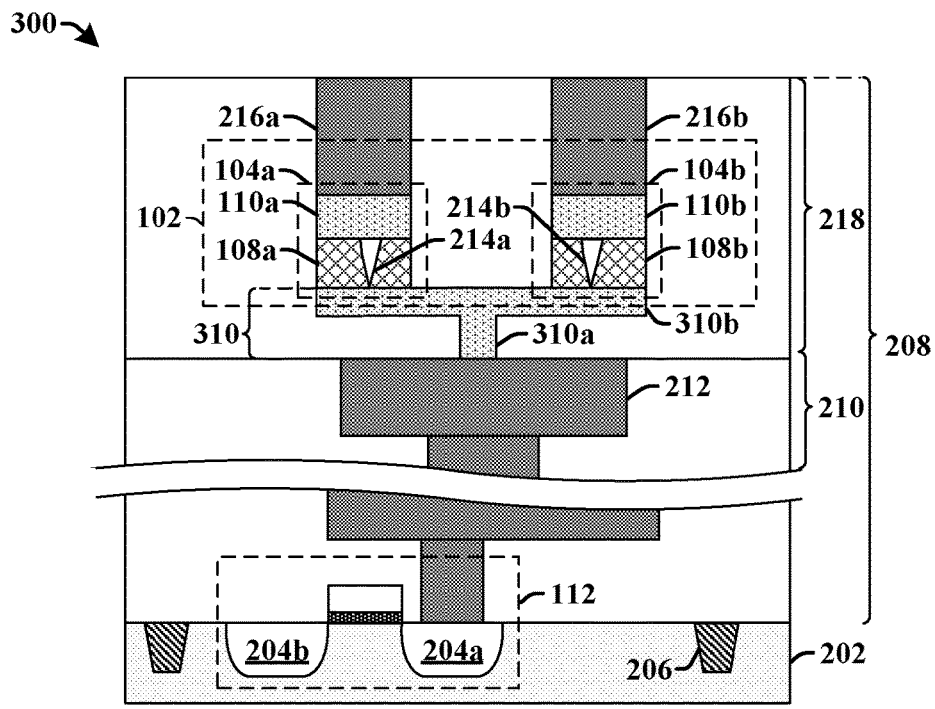
FIG. 3 illustrates a cross-sectional view of some additional embodiments of an integrated chip comprising a memory circuit having an RRAM cell with multiple RRAM elements.

Although FIG. 2 illustrates an RRAM cell 102 with a first RRAM element 104a coupled to a second RRAM element 104b by a lower interconnect layer 212, it will be appreciated that the disclosed memory cell is not limited to such configurations. Rather, the first RRAM element 104a may be coupled to the second RRAM element 104b by way of any conductive element that forms an electrical path between the first data storage layer 108a and the second data storage layer 108b. For example, in some alternative embodiments shown below in FIG. 3, a disclosed memory circuit 300 may have a first data storage layer 108a coupled to the second data storage layer 108b by a conductive element comprising a shared electrode.

The memory circuit 300 comprises an RRAM cell 102 having a first RRAM element 104a and a second RRAM element 104b. The first RRAM element 104a comprises a first data storage layer 108a arranged between a shared electrode 310 and a first disjunct electrode 110a. The first disjunct electrode 110a is further coupled to a first upper via 216a. The second RRAM element 104b comprises a second data storage layer 108b arranged between the shared electrode 310 and a second disjunct electrode 110b. The second disjunct electrode 110b is further coupled to a second upper via 216b.

The shared electrode 310 continuously extends in a vertical direction between a lower interconnect layer 212 and the first and second data storage layers, 108a and 108b. The shared electrode 310 also continuously extends in a horizontal direction between the first data storage layer 108a and the second data storage layer 108b. In some embodiments, the first data storage layer 108a and the second data storage layer 108b may be in direct contact with an upper surface of the shared electrode 310. In some embodiments, the shared electrode 310 may comprise a lower region 310a and an upper region 310b that laterally extends past opposing sidewalls of the lower region 310a.

In some embodiments, the shared electrode 310 may be a different composition of materials than the underlying lower interconnect layer 212. For example, the shared electrode 310 may comprise titanium and/or tantalum, while the lower interconnect layer 212 may comprise copper and/or aluminum. In some embodiments (not shown), the shared electrode 310 may be laterally separated from a via by the lower ILD layer 210, so that the shared electrode 310 and the via are intersected by a horizontal plane that is parallel to an upper surface of the substrate 202

Figure 4:
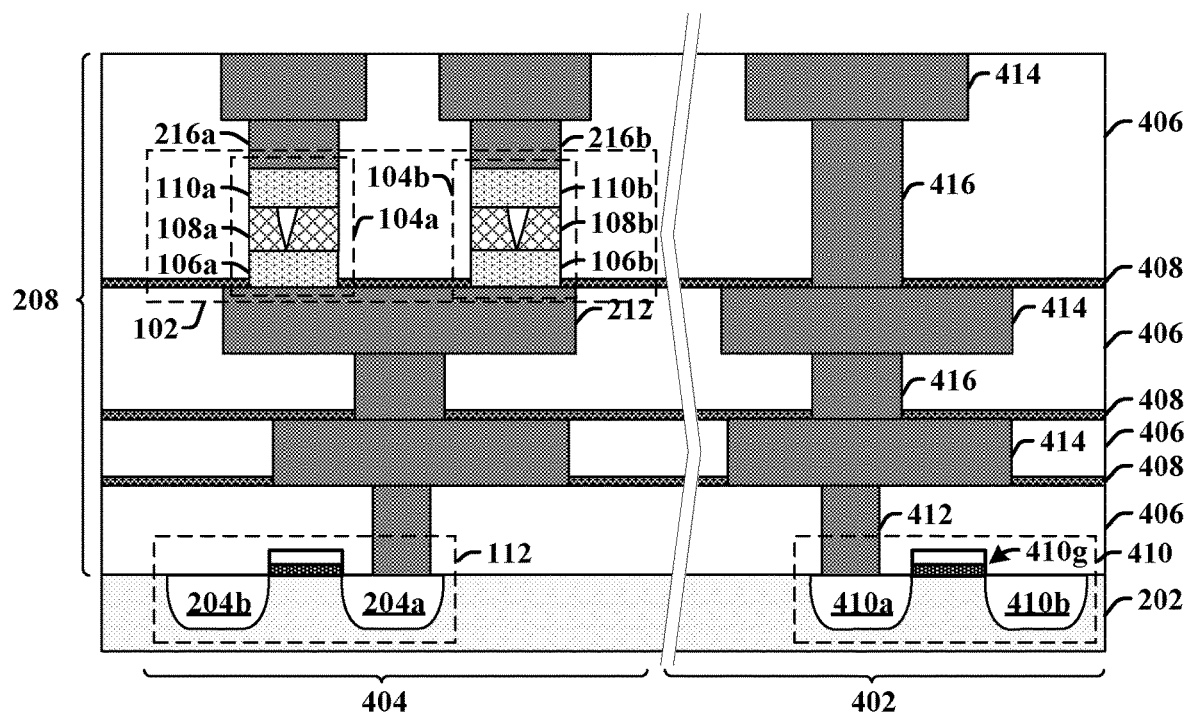
FIG. 4 illustrates a cross-sectional view of some additional embodiments of an integrated chip having a logic region and an embedded memory region comprising an RRAM cell having multiple RRAM elements.

FIG. 4 illustrates a cross-sectional view of some additional embodiments of an integrated chip 400 having a logic region and an embedded memory region comprising an RRAM cell having multiple RRAM elements.

The integrated chip 400 comprises a substrate 202 including a logic region 402 and an embedded memory region 404. A dielectric structure 208 is arranged over the substrate 202. The dielectric structure 208 comprises a plurality of stacked ILD layers 406 separated by etch stop layers 408. In some embodiments, the plurality of stacked ILD layers 406 may comprise one or more of an oxide layer, a low-k dielectric layer, an ultra low-k dielectric layer, or the like. In some embodiments, the etch stop layers 408 may comprise a nitride (e.g., silicon nitride), a carbide (e.g., silicon carbide), or the like.

The logic region 402 comprises a transistor device 410 arranged within the substrate 202. The transistor device 410 comprises a source region 410a, a drain region 410b separated from the source region 410a by a channel region, and a gate structure 410g over the channel region. In some embodiments, the transistor device 410 may comprise a high-k metal gate (HKMG) transistor. The source region 410a is coupled to a first plurality of interconnect layers surrounded by the dielectric structure 208. The first plurality of interconnect layers comprise a conductive contact 412, conductive wires 414, and conductive vias 416. In some embodiments, the first plurality of interconnect layers may comprise copper, tungsten, aluminum, or the like.

The embedded memory region 404 comprises a control device 112 arranged within the substrate 202. The control device 112 is coupled to an RRAM cell 102 by way of a second plurality of interconnect layers. The RRAM cell 102 comprises a first RRAM element 104a and a second RRAM element 104b. The second plurality of interconnect layers comprise a lower interconnect layer 212 electrically coupled to the first RRAM element 104a and the second RRAM element 104b. The first RRAM element 104a and the second RRAM element 104b are arranged along a horizontal plane that intersects one of the conductive vias 416 of the first plurality of interconnect layers.

Figure 5:
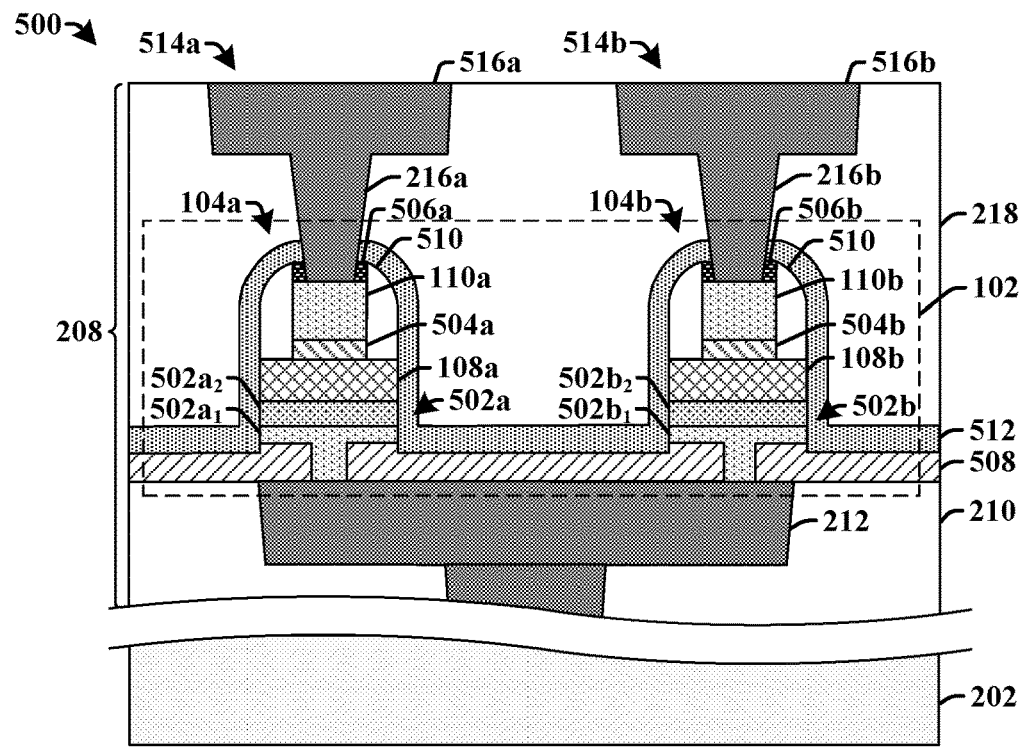
FIG. 5 illustrates a cross-sectional view of some additional embodiments of an integrated chip comprising a memory circuit having an RRAM cell with multiple RRAM elements.

FIG. 5 illustrates a cross-sectional view of some additional embodiments of an integrated chip 500 having an RRAM cell comprising multiple RRAM elements.

The integrated chip 500 comprises an RRAM cell 102 arranged over a lower interconnect layer 212 within a lower ILD layer 210. The RRAM cell 102 comprises a first RRAM element 104a and a second RRAM element 104b. The first RRAM element 104a has a first conjunct electrode 502a separated from a first disjunct electrode 110a by a first data storage layer 108a having a variable resistance. In some embodiments, the first conjunct electrode 502a may comprise a barrier layer $502a_1$ (e.g., titanium nitride, tantalum nitride, or the like) and a metal layer $502a_2$ (e.g., titanium, tantalum, or the like). In some embodiments, the first RRAM element 104a may further comprise a first capping layer 504a between the first data storage layer 108a and the first disjunct electrode 110a, and/or a first hard mask layer 506a over the first disjunct electrode 110a.

The second RRAM element 104b has a second conjunct electrode 502b separated from a second disjunct electrode 110b by a second data storage layer 108b having a variable resistance. In some embodiments, the second conjunct electrode 502b may comprise a barrier layer 502b1 (e.g., titanium nitride, tantalum nitride, or the like) and a metal layer 502b2. In some embodiments, the second RRAM element 104b may further comprise a second capping layer 504b between the second data storage layer 108b and the second disjunct electrode 110b, and/or a second hard mask layer 506b over the second disjunct electrode 110b. In some embodiments, sidewall spacers 510 may be arranged on opposing sides of the first disjunct electrode 110a and the second disjunct electrode 110b.

In some embodiments, a lower insulating layer 508 is arranged over the lower ILD layer 210 and the lower interconnect layer 212. In some embodiments, the first conjunct electrode 502a and the second conjunct electrode 502b respectively comprise a horizontally extending lower surface arranged over the lower insulating layer 508 and a protrusion that protrudes outward from the horizontally extending lower surface and extends through the lower insulating layer 508 to the lower interconnect layer 212.

In some embodiments, the first conjunct electrode 502a, the first disjunct electrode 110a, the second conjunct electrode 502b, and the second disjunct electrode 110b may comprise a metal, such as tantalum (Ta), titanium (Ti), or the like. In some embodiments, the first data storage layer 108a and the second data storage layer 108b may comprise one or more high-k dielectric materials, such as titanium aluminum oxide, hafnium tantalum oxide, zirconium lanthanum oxide, or the like. In some embodiments, the first capping layer 504a and the second capping layer 504b may comprise a metal (e.g., such as titanium (Ti), hafnium (Hf), platinum (Pt), aluminum (Al), or the like) or a metal oxide (e.g., such as titanium oxide (TiO), hafnium oxide (HfO), zirconium oxide (ZrO), germanium oxide (GeO), cesium oxide (CeO), or the like). In some embodiments, the first hard mask layer 506a and the second hard mask layer 506b may comprise silicon oxy-nitride (SiON), silicon dioxide ($SiO_2$), or PE-SiN, or the like. In some embodiments, the sidewall spacers 510 may comprise a nitride (e.g., silicon nitride or silicon oxy-nitride), an oxide (e.g., silicon dioxide), or the like.

An upper ILD layer 218 is disposed over the first RRAM element 104a and the second RRAM element 104b. The upper ILD layer 218 surrounds a first upper interconnect structure 514a disposed onto the first disjunct electrode 110a and a second upper interconnect structure 514b disposed onto the second disjunct electrode 110b. The upper interconnect structures, 514a and 514b, respectively comprises an upper via, 216a and 216b, and an upper wire, 516a and 516b. In some embodiments, the upper ILD layer 218 may be separated from the first RRAM element 104a and the second RRAM element 104b by an upper insulating layer 512. In some embodiments, the upper insulating layer 512 may comprise silicon nitride, silicon oxide, or the like.

Figure 6:
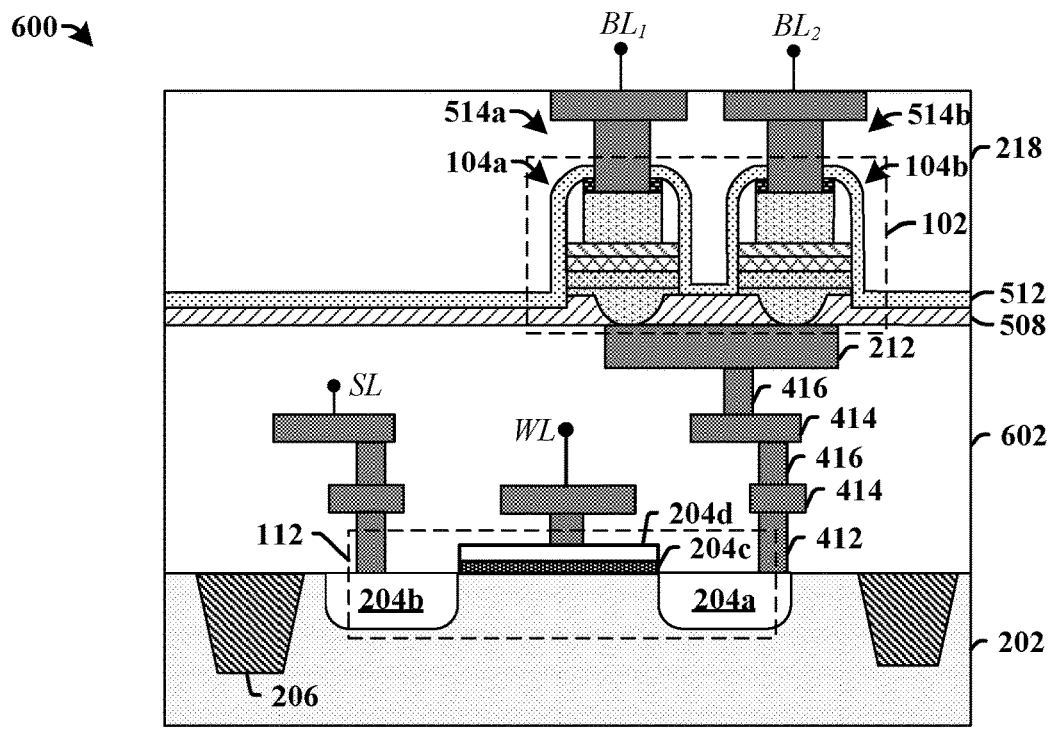
FIG. 6 illustrates a cross-sectional view of some additional embodiments of an integrated chip comprising a memory circuit having an RRAM cell with multiple RRAM elements.

FIG. 6 illustrates a cross-sectional view of some embodiments of an integrated chip 600 comprising an RRAM cell comprising multiple RRAM elements.

The integrated chip 600 comprises a control device 112 arranged within a substrate 202. The control device 112 comprises a drain region 204a separated from a source region 204b by a channel region. A gate electrode 204d is separated from the channel region by a gate dielectric 204c.

A lower ILD structure 602 is arranged over the substrate 202. A plurality of interconnect layers including conductive contacts 412, conductive wires 414, and conductive vias 416 are surrounded by the lower ILD structure 602. The conductive wires 414 includes a source-line SL comprising a first interconnect wire that is electrically coupled to the source region 204b. In some embodiments, the source-line SL may be arranged in a second metal wire layer that is connected to the source region 204b through a contact, a first metal wire layer, and a first metal via layer. The conductive wires 414 further comprise a word-line WL comprising a second interconnect wire that is electrically coupled to the gate electrode 204d. In some embodiments, the word-line WL may be arranged in the first metal wire layer that is connected to the gate electrode 204d by way of a contact.

An RRAM cell 102 is arranged over the lower ILD structure 602. The RRAM cell 102 comprises a first RRAM element 104a and a second RRAM element 104b. The first RRAM element 104a and the second RRAM element 104b are directly connected to the drain region 204a by the plurality of interconnect layers. The first RRAM element 104a is further coupled to a first bit-line $BL_1$ by way of a first upper interconnect structure 514a and the second RRAM element 104b is further coupled to a second bit-line $BL_2$ by way of a second upper interconnect structure 514b.

Although integrated chip 600 illustrates the word-line WL, the source-line SL, the first bit-line $BL_1$, the second bit-line $BL_2$, and the RRAM cell 102 as being located at certain levels within a BEOL stack, it will be appreciated that the positon of these elements is not limited to those illustrated positions. Rather, the elements may be at different locations within a BEOL stack. For example, in some alternative embodiments, the RRAM cell 102 may be located between a second and third metal interconnect wire.

Figure 7:
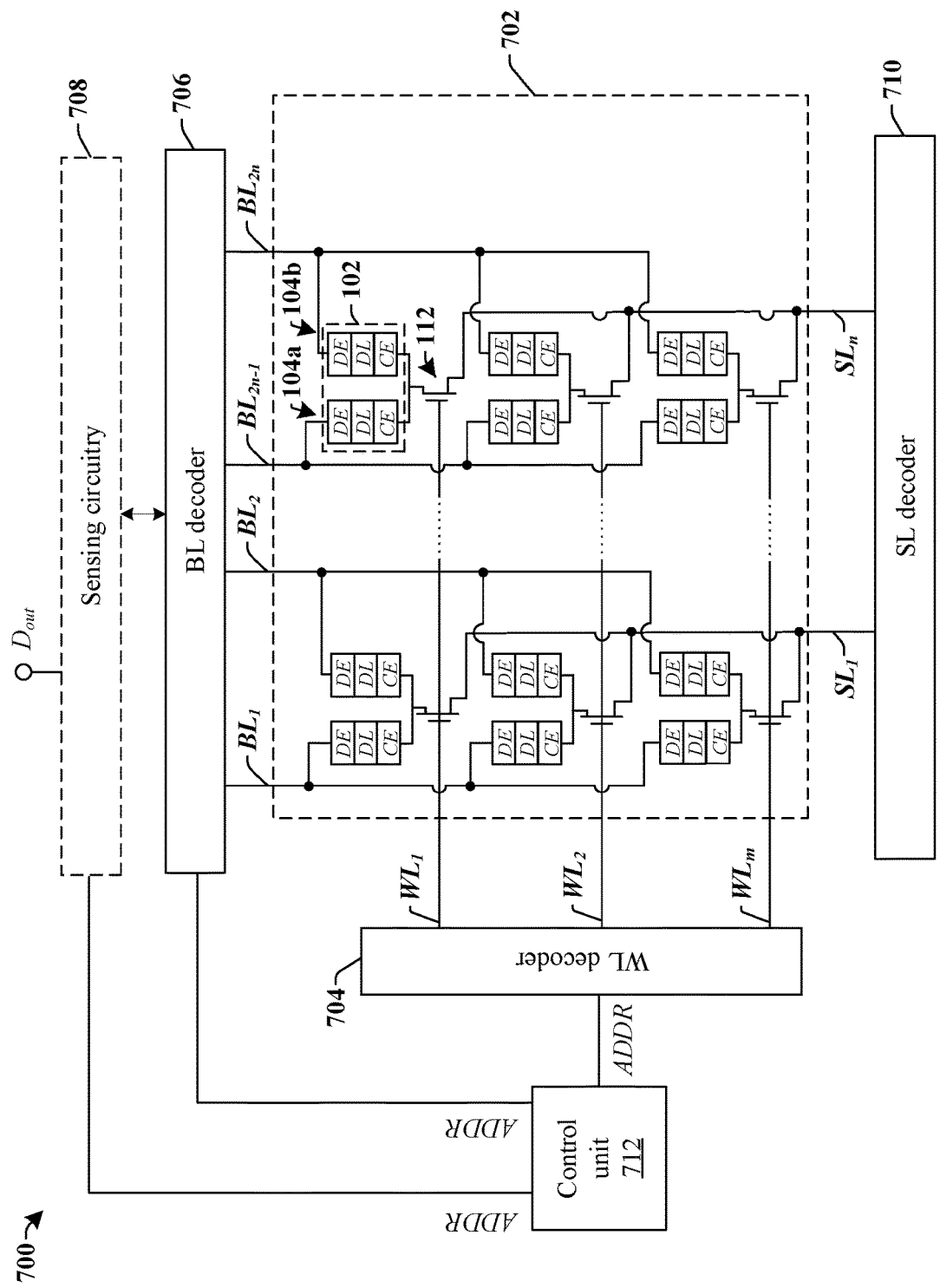
FIG. 7 illustrates a schematic diagram of some embodiments of a memory array having RRAM cells that respectively comprise multiple RRAM elements.

FIG. 7 illustrates a schematic diagram of some embodiments of a memory circuit 700 having a plurality of RRAM cells respectively comprising multiple RRAM elements.

The memory circuit 700 comprises a memory array 702 having a plurality of RRAM cells 102. The plurality of RRAM cells 102 are arranged within the memory array 702 in rows and/or columns. The plurality of RRAM cells 102 within a row are operably coupled to a word-line $WL_1$-$WL_m$. The plurality of RRAM cells 102 within a column are operably coupled to two or more bit-lines $BL_1$-$BL_{2n}$ and a source-line $SL_1$-$SL_n$.

A control device 112 comprising an access transistor is coupled to a first RRAM element 104a and a second RRAM element 104b within a respective one of the plurality of RRAM cells 102. In some embodiments, the first RRAM element 104a has a first conjunct electrode coupled to the control device 112 and a first disjunct electrode coupled to a first bit-line $BL_{2n-1}$, while the second RRAM element 104b has a second conjunct electrode coupled to the control device 112 and a second disjunct electrode coupled to a second bit-line $BL_{2n}$. The control device 112 further has a gate coupled to a word-line $WL_1$-$WL_m$ and a source coupled to a source-line $SL_1$-$SL_n$.

The memory array 702 is coupled to support circuitry that is configured to read data from and/or write data to a plurality of RRAM cells 102. In some embodiments, the support circuitry comprises a word-line decoder 704, a bit-line decoder 706, sensing circuitry 708 comprising one or more sense amplifiers, a source-line decoder 710, and/or a control unit 712. The word-line decoder 704 is configured to selectively apply a signal (e.g., a current and/or voltage) to one of the word-lines $WL_1$-$WL_m$, the bit-line decoder 706 is configured to selectively apply a signal to one or more of the plurality of bit-lines $BL_1$-$BL_{2n}$, and the source-line decoder 710 is configured to selectively apply a signal to one or more of the plurality of source-lines $SL_1$-$SL_n$ based upon an address ADDR received from the control unit 712. By selectively applying signals to the word-lines $WL_1$-$WL_m$, the bit-lines $BL_1$-$BL_{2n}$, and/or the source-lines $SL_1$-$SL_n$, the support circuitry is able to perform forming, set, reset, and read operations on selected ones of plurality of RRAM cells 102.

Figures 8A, 8B:
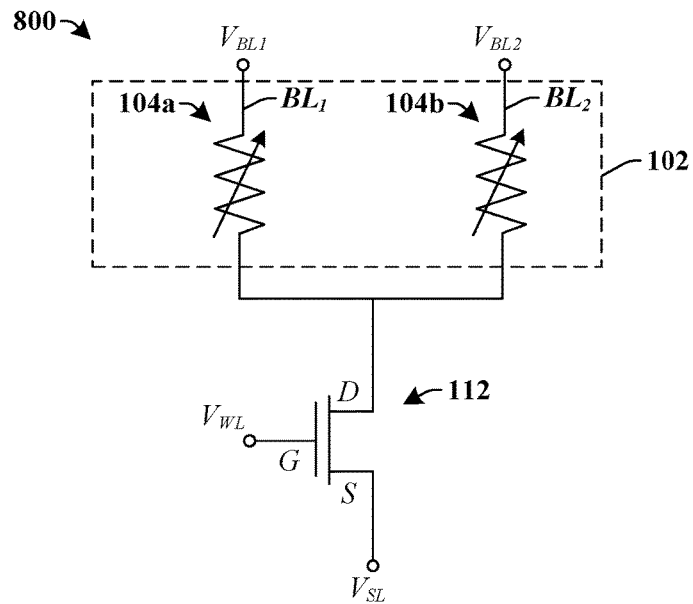
FIGS. 8A-8B illustrate some embodiments of operating conditions of a memory circuit having an RRAM cell with multiple RRAM elements.

FIGS. 8A-8B illustrate some embodiments of operating conditions of a memory circuit (e.g., memory circuit 100) comprising an RRAM cell having multiple RRAM elements respectively configured to form a conductive filament.

FIG. 8A illustrates a schematic diagram 800 of an RRAM cell 102 having multiple RRAM elements, 104a and 104b, coupled to a drain terminal D of a control device 112 comprising a transistor device. As shown in schematic diagram 800, during operation of the RRAM cell 102 a first bit-line voltage $V_{BL1}$ may be applied to a first bit-line $BL_1$ coupled to a first RRAM element 104a and a second bit-line voltage $V_{BL2}$ may be applied to a second bit-line $BL_2$ coupled to a second RRAM element 104b. A word-line voltage $V_{WL}$ may be applied to a gate terminal G of a control device 112 and a source-line voltage $V_{SL}$ may be applied to a source terminal S of the control device 112.

FIG. 8B illustrates a table 802 showing exemplary bias voltage values that may be applied to the RRAM cell 102 shown in schematic diagram 800 to perform forming, set, reset, and read operations. The table 802 has separate columns for selected RRAM cells and unselected RRAM cells. Although specific voltage values are illustrated in the table 802, it will be appreciated that the operations described in the table 802 are not limited to those voltage values, but rather may be performed using different voltages values in some alternative embodiments.

Rows 804-806 of table 802 describe some exemplary bias voltage values that may be used to perform forming operations on the first RRAM element 104a and the second RRAM element 104b of the RRAM cell 102 shown in schematic diagram 800.

As shown in row 804 of table 802, to perform a first forming operation to form a first initial conductive filament within a first RRAM element 104a, a word-line voltage $V_{WL}$ having a non-zero value (e.g., between approximately 0.8 V and approximately 1.4 V) is applied to the gate terminal G of the control device 112. A first bit-line voltage $V_{BL1}$ having a non-zero value (e.g., between approximately 2.8 V and approximately 3.6 V) is applied to the first bit-line BL/and a second bit-line voltage $V_{BL2}$ having a substantially zero value is concurrently applied to the second bit-line $BL_2$. A source-line voltage $V_{SL}$ having a substantially zero value is applied to the source terminal S of the control device 112. The bias conditions of row 804 form a potential difference across the first RRAM element 104a that is sufficiently large to form the first initial conductive filament.

As shown in row 806 of table 802, to perform a second forming operation to form a second initial conductive filament within a second RRAM element 104b, a word-line voltage $V_{WL}$ having a non-zero value (e.g., between approximately 0.8 V and approximately 1.4 V) is applied to the gate terminal G of the control device 112. A first bit-line voltage $V_{BL1}$ having a substantially zero value is applied to the first bit-line BL/and a second bit-line voltage $V_{BL2}$ having a non-zero value (e.g., between approximately 2.8 V and approximately 3.6 V) is concurrently applied to the second bit-line $BL_2$. A source-line voltage $V_{SL}$ having a substantially zero value is applied to the source terminal S of the control device 112. The bias conditions of row 806 form a potential difference across the second RRAM element 104b that is sufficiently large to form the second initial conductive filament Row 808 describes some exemplary bias voltage values that may be used to perform a set operation on the first RRAM element 104a and the second RRAM element 104b of the RRAM cell 102 shown in schematic diagram 800. During the set operation, the bias voltage values induce a conductive path/filament (e.g., chains of oxygen vacancies) to form within the first RRAM element 104a and the second RRAM element 104b to form a low resistive state within the RRAM cell 102.

As shown in row 808 of table 802, to perform a set operation a word-line voltage having a non-zero value (e.g., between approximately 1.6 V and approximately 2.4 V) is applied to the gate terminal G of the control device 112. A first bit-line voltage $V_{BL1}$ and a second bit-line voltage $V_{BL2}$ having non-zero values (e.g., between approximately 1.6 V and approximately 2.0 V) are concurrently applied to the first bit-line BL/and the second bit-line $BL_2$ A source-line voltage having a substantially zero value is applied to the source terminal S of the control device 112. The bias conditions of row 808 cause oxygen vacancies to accumulate within separate data storage layers of the first RRAM element 104a and the second RRAM element 104b. The accumulation of oxygen vacancies forms separate conductive filaments within the data storage layers, causing a low resistive state to be written to the RRAM cell 102.

Row 810 describes some exemplary bias voltage values that may be used to perform a reset operation on the first RRAM element 104a and the second RRAM element 104b of the RRAM cell 102 shown in schematic diagram 800. During the reset operation, the bias voltage values break conductive paths/filaments within the first RRAM element 104a and the second RRAM element 104b to form a high resistive state within the RRAM cell 102.

As shown in row 810 of table 802, to perform a reset operation a word-line voltage having a non-zero value (e.g., between approximately 1.8 V and approximately 3.0 V) is applied to the gate terminal G of the control device 112. A first bit-line voltage $V_{BL1}$ and a second bit-line voltage $V_{BL2}$ having a substantially zero value are concurrently applied to the first bit-line BL/and the second bit-line $BL_2$. A source-line voltage Vs', having a non-zero value (e.g., between approximately 1.6 V and approximately 2.0 V) is applied to the source terminal S of the control device 112. The bias conditions of row 810 drive oxygen vacancies out from within the separate data storage layers of the first RRAM element 104a and the second RRAM element 104b. Driving oxygen vacancies out of the data storage layers break the separate conductive filaments within the data storage layers, causing a high resistive state to be written to the RRAM cell 102.

As shown in row 812 of table 802, to perform a read operation a word-line voltage having a non-zero value (e.g., between approximately 0.9 V and approximately 1.3 V) is applied to the gate terminal G of the control device 112. A first bit-line voltage $V_{BL1}$ and a second bit-line voltage $V_{BL2}$ having a substantially zero value are concurrently applied to the first bit-line BL/and the second bit-line $BL_2$. A source-line voltage Vs', having a non-zero value (e.g., between approximately 0.2 V and approximately 0.4 V) is applied to the source terminal S of the control device 112. The bias conditions of row 812 cause separate read currents to be output from the first RRAM element 104a and the second RRAM element 104b, which are respectively dependent upon resistive states of the first RRAM element 104a and the second RRAM element 104b.

FIGS. 9-17 illustrate cross-sectional views 900-1700 of some embodiments of a method of forming an integrated chip comprising a memory circuit having an RRAM memory cell with multiple RRAM elements. Although FIGS. 9-17 are described in relation to a method, it will be appreciated that the structures disclosed in FIGS. 9-17 are not limited to such a method, but instead may stand alone as structures independent of the method.

Figure 9:
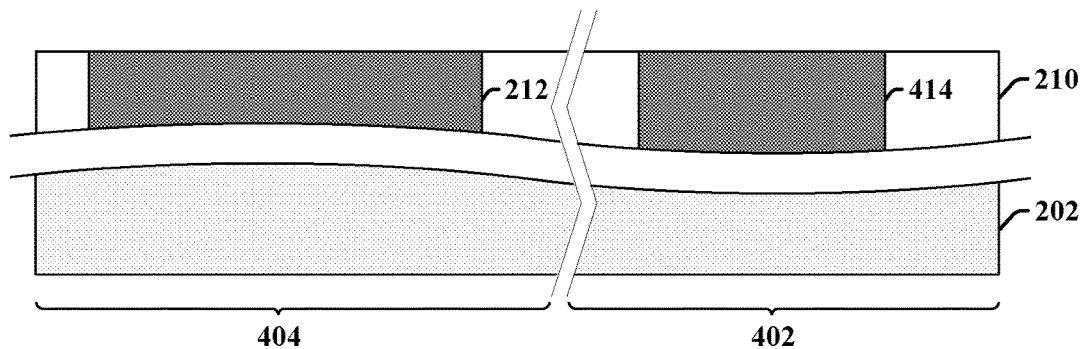
FIGS. 9-17 illustrate cross-sectional views of some embodiments of a method of forming an integrated chip comprising a memory circuit having an RRAM cell with multiple RRAM elements.

As shown in cross-sectional view 900 of FIG. 9, a lower interconnect layer 212 is formed within a lower inter-level dielectric (ILD) layer 210 over a substrate 202. In various embodiments, the substrate 202 may be any type of semiconductor body (e.g., silicon, SiGe, SOI, or the like), such as a semiconductor wafer and/or one or more die on a wafer, as well as any other type of semiconductor and/or epitaxial layers, associated therewith. In some embodiments, the lower interconnect layer 212 may be formed by selectively etching the lower ILD layer 210 (e.g., an oxide, a low-k dielectric, an ultra low-k dielectric, or the like) to define an opening within the lower ILD layer 210. A metal (e.g., copper, aluminum, etc.) is then deposited to fill the opening, and a planarization process (e.g., a chemical mechanical planarization process) is performed to remove excess metal.

In some embodiments, the substrate 202 may comprise a logic region 402 and an embedded memory region 404. In some such embodiments, a conductive wire 414 may be formed in the lower ILD layer 210 within the logic region 402 concurrent to the formation of a conductive wire comprising the lower interconnect layer 212 within the embedded memory region 404.

Figure 10:
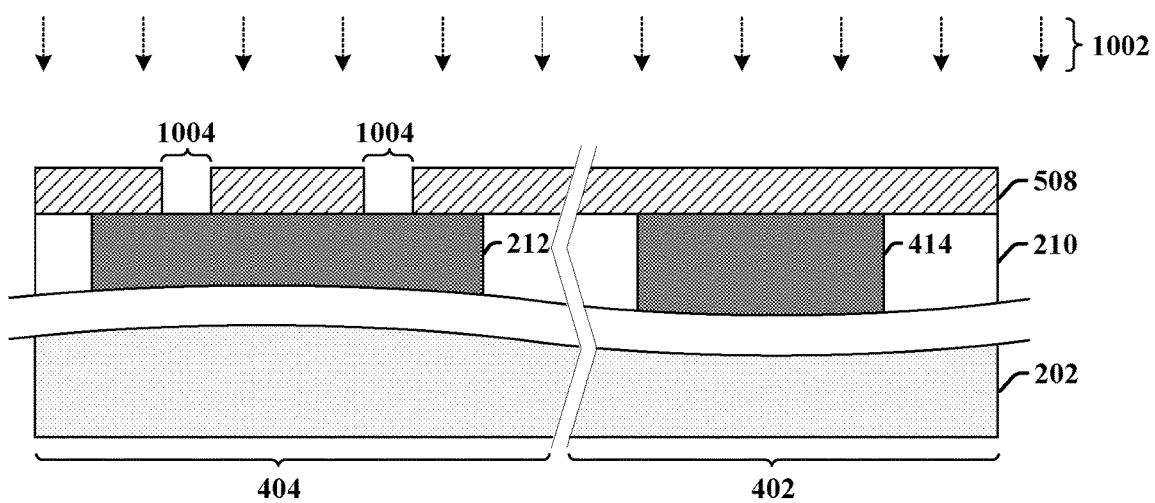

As shown in cross-sectional view 1000 of FIG. 10, a lower insulating layer 508 is formed onto the lower interconnect layer 212 and the lower ILD layer 210. In some embodiments, the lower insulating layer 508 may comprise silicon-nitride (SiN), silicon-carbide (SiC), or a similar composite dielectric film. In some embodiments, the lower insulating layer 508 may be formed by a deposition technique (e.g., physical vapor deposition (PVD), chemical vapor deposition (CVD), PE-CVD, atomic layer deposition (ALD), sputtering, or the like) to a thickness in a range of between approximately 200 angstroms and approximately 300 angstroms. In other embodiments, the lower insulating layer 508 may be formed by a deposition technique to smaller or larger thicknesses.

After being deposited, the lower insulating layer 508 is selectively exposed to a first etchant 1002 (e.g., a dry etchant and/or a wet etchant) that forms sidewalls defining a plurality of openings 1004 within the lower insulating layer 508. The plurality of openings 1004 extend through the lower insulating layer 508 to the lower interconnect layer 212. In some embodiments, the lower insulating layer 508 may be selectively exposed to the first etchant 1002 according to a first masking layer (not shown) formed over the lower insulating layer 508. In some embodiments, the first etchant 1002 does not form openings within the lower insulating layer 508 within the logic region 402.

Figure 11:
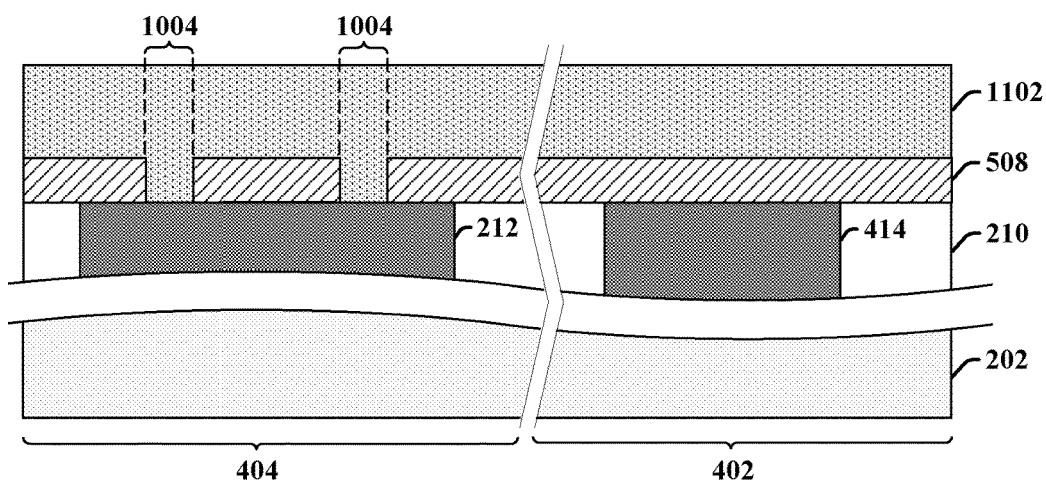

As shown in cross-sectional view 1100 of FIG. 11, a conjunct electrode structure 1102 is formed over the lower interconnect layer 212 and the lower ILD layer 210. The conjunct electrode structure 1102 extends from within the plurality of openings 1004 to a position overlying the lower insulating layer 508. In some embodiments, the conjunct electrode structure 1102 is formed by performing separate depositions to form a first conjunct electrode film and subsequently forming a second conjunct electrode film over the first conjunct electrode film. In some embodiments, the first conjunct electrode film may comprise a barrier layer such as tantalum nitride (TaN), titanium nitride (TiN), or the like. In some embodiments, the second conjunct electrode film may comprise a metal such as tantalum (Ta), titanium (Ti), or the like.

Figure 12:
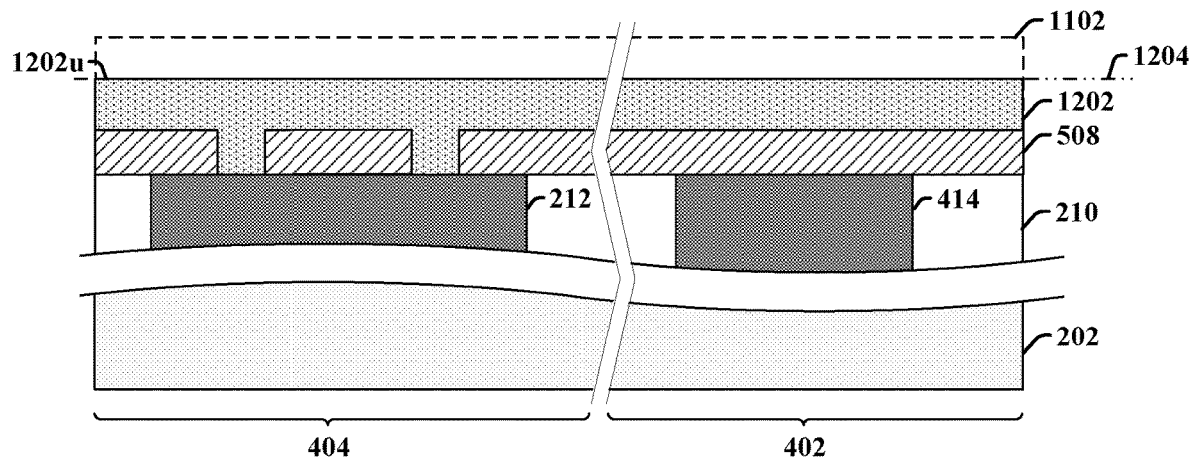

As shown in cross-sectional view 1200 of FIG. 12, a planarization process is performed on the conjunct electrode structure 1102 (along line 1204). The planarization process removes a part of the conjunct electrode structure 1102 and results in a conjunct electrode structure 1202 having a planar upper surface 1202u facing away from the substrate 202. In some embodiments, the planarization process may comprise a chemical mechanical planarization (CMP) process. In some embodiments, the planarization process results in the conjunct electrode structure 1202 having a thickness in a range of between approximately 100 angstroms and approximately 500 angstroms over the lower insulating layer 508.

Figure 13:
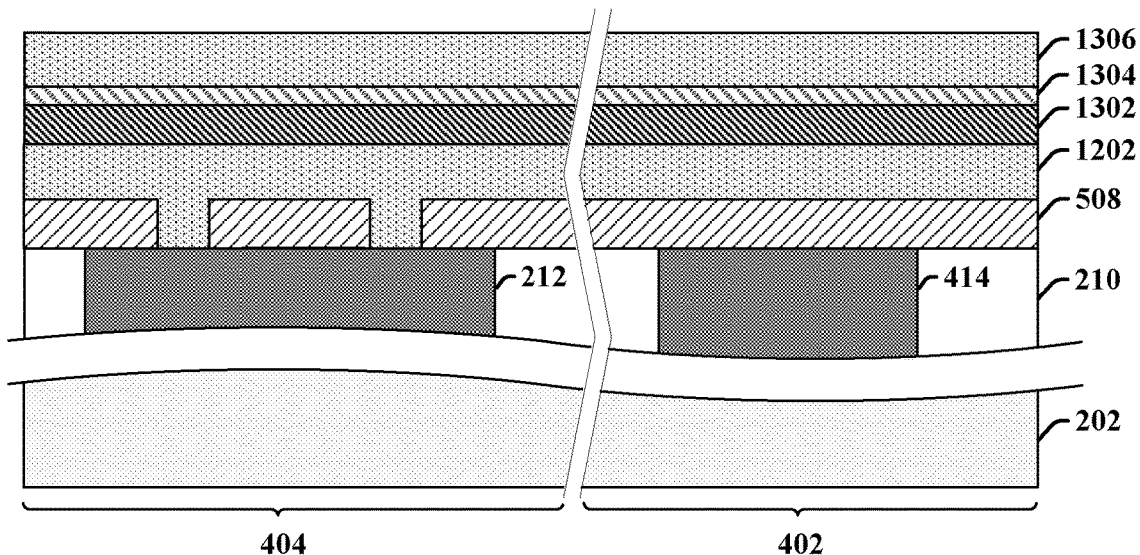

As shown in cross-sectional view 1300 of FIG. 13, a data storage film 1302 is formed over the conjunct electrode structure 1202, a capping layer film 1304 is formed over the data storage film 1302, and a disjunct electrode structure 1306 is formed over the capping layer film 1304. In some embodiments, the data storage film 1302 may comprise a high-k dielectric material having a variable resistance. For example, in some embodiments, the data storage film 1302 may comprise hafnium oxide ($HfO_x$), zirconium oxide ($ZrO_x$), aluminum oxide ($AlO_x$), nickel oxide ($NiO_x$), tantalum oxide ($TaO_x$), titanium oxide (TiOx), or the like. In some embodiments, the data storage film 1302 may be formed to a thickness in a range of between approximately 25 angstroms and approximately 75 angstroms. In some embodiments, the capping layer film 1304 may comprise a metal (e.g., such as titanium (Ti), hafnium (Hf), platinum (Pt), aluminum (Al), or the like) or a metal oxide (e.g., such as titanium oxide ($TiO_x$), hafnium oxide ($HfO_x$), zirconium oxide ($ZrO_x$), germanium oxide ($GeO_x$), cesium oxide ($CeO_x$), or the like). In some embodiments, the disjunct electrode structure 1306 may comprise a metal, such as titanium (Ti), tantalum (Ta), or the like. In some embodiments, the disjunct electrode structure 1306 may be formed by way of a deposition technique (e.g., PVD, CVD, PE-CVD, sputtering, ALD, or the like). In some embodiments, the disjunct electrode structure 1306 may have a thickness in a range of between approximately 100 angstroms and approximately 400 angstroms.

Figure 14:
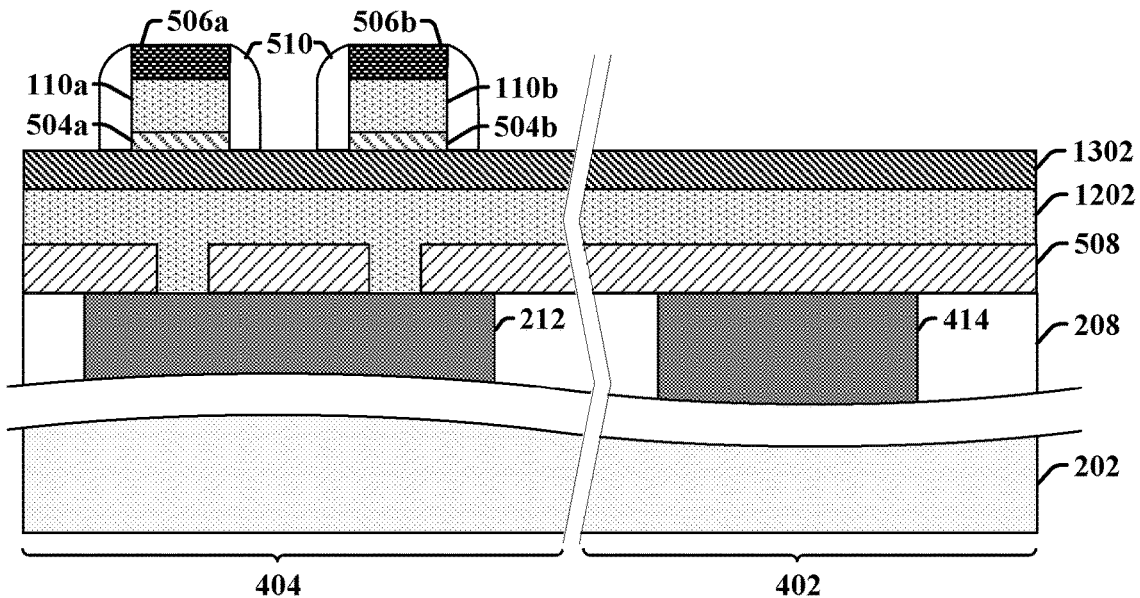

As shown in cross-sectional view 1400 of FIG. 14, a first patterning process is performed. The first patterning process removes the capping layer film (1304 of FIG. 13) and the disjunct electrode structure (1306 of FIG. 13) from the logic region 402. The first patterning process also selectively removes the capping layer film (1304 of FIG. 13) and the disjunct electrode structure (1306 of FIG. 13) from the embedded memory region 404 to define a first disjunct electrode 110a and a second disjunct electrode 110b. In some embodiments, the conjunct electrode structure 1202 continuously extends below the first disjunct electrode 110a and the second disjunct electrode 110b. In some embodiments, the first patterning process comprises forming a first hard mask layer 506a and a second hard mask layer 506b over the disjunct electrode structure (1306 of FIG. 13). The disjunct electrode structure is then exposed to a first etchant (e.g., a dry etchant and/or a wet etchant) according to the first hard mask layer 506a and the second hard mask layer 506b to remove unmasked parts of the capping layer film (1304 of FIG. 13) and the disjunct electrode structure (1306 of FIG. 13). In various embodiments, the first hard mask layer 506a and the second hard mask layer 506b may comprise silicon-oxide (SiO₂), silicon-oxynitride (SiON), silicon-nitride (SiN) silicon-carbide (SiC), or the like.

In some embodiments, sidewall spacers 510 may be formed on opposing sides of the first disjunct electrode 110a and the second disjunct electrode 110b. The sidewall spacers 510 may be formed by depositing a spacer layer on the data storage film 1302, the first disjunct electrode 110a, the second disjunct electrode 110b, the first hard mask layer 506a, and the second hard mask layer 506b. In some embodiments, the spacer layer may be deposited by a deposition technique (e.g., PVD, CVD, PE-CVD, ALD, sputtering, etc.) to a thickness in a range of between approximately 400 angstroms and approximately 600 angstroms. The spacer layer is subsequently etched to remove the spacer layer from horizontal surfaces, leaving the spacer layer along opposing sides of the disjunct electrodes, 110a and 110b, as the sidewall spacers 510. In various embodiments, the spacer layer may comprise silicon nitride, silicon dioxide (SiO₂), silicon oxy-nitride (e.g., SiON), or the like.

Figure 15:
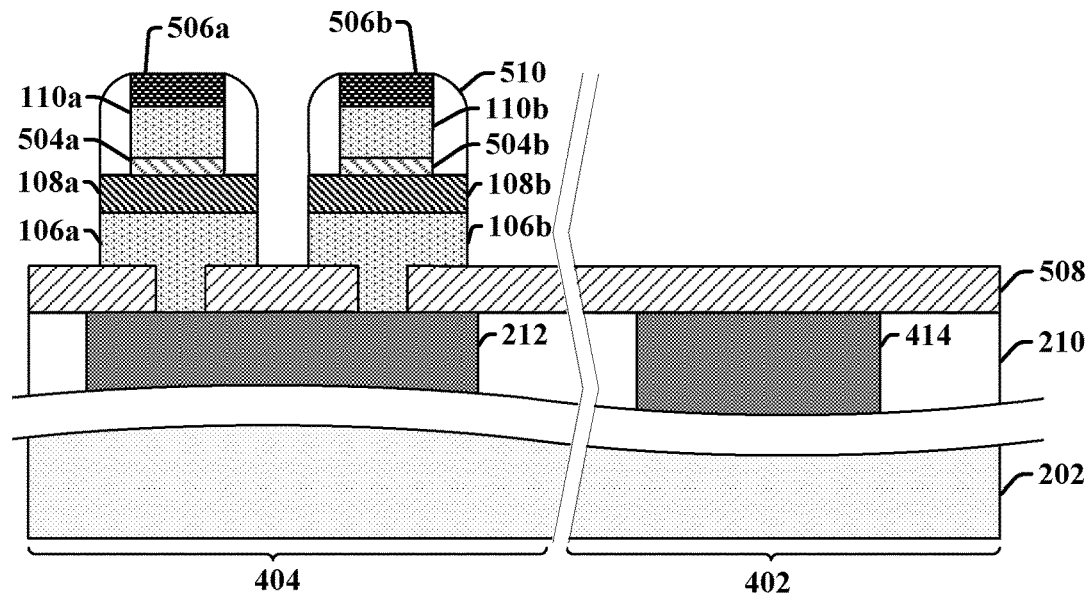

As shown in cross-sectional view 1500 of FIG. 15, a second patterning process is performed. The second patterning process removes the data storage film (1302 of FIG. 14) and the conjunct electrode structure (1202 of FIG. 14) from the logic region 402. The second patterning process also selectively removes the data storage film (1302 of FIG. 14) and the conjunct electrode structure (1202 of FIG. 14) from the embedded memory region 404 to define a first data storage layer 108a over a first conjunct electrode 106a and a second data storage layer 108b over a second conjunct electrode 106b. In some embodiments, the second patterning process selectively exposes the data storage film (1302 of FIG. 14) and the conjunct electrode structure (1202 of FIG. 14) to a second etchant according to a mask comprising the first hard mask layer 506a, the second hard mask layer 506b, and the sidewall spacers 510.

Figure 16:
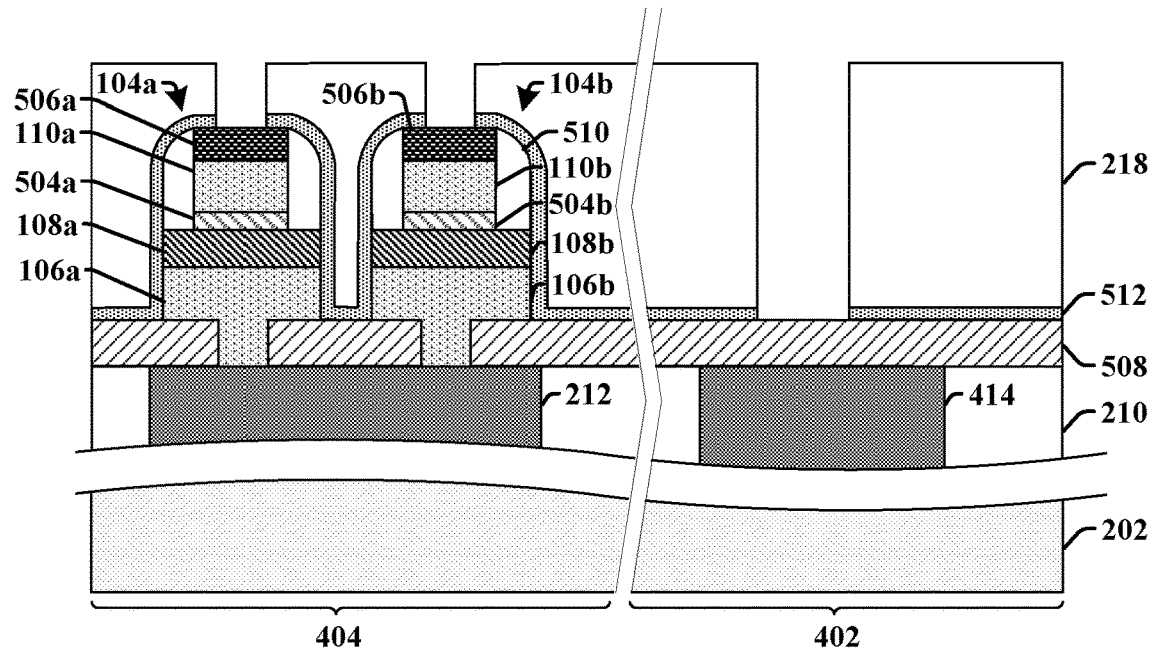

As shown in cross-sectional view 1600 of FIG. 16, an upper insulating layer 512 is formed over a first RRAM element 104a and a second RRAM element 104b. An upper inter-level dielectric (ILD) layer 218 is subsequently formed over the upper insulating layer 512. The upper insulating layer 512 has a first side facing the substrate 202 and a second side that abuts the upper ILD layer 218.

Figure 17:
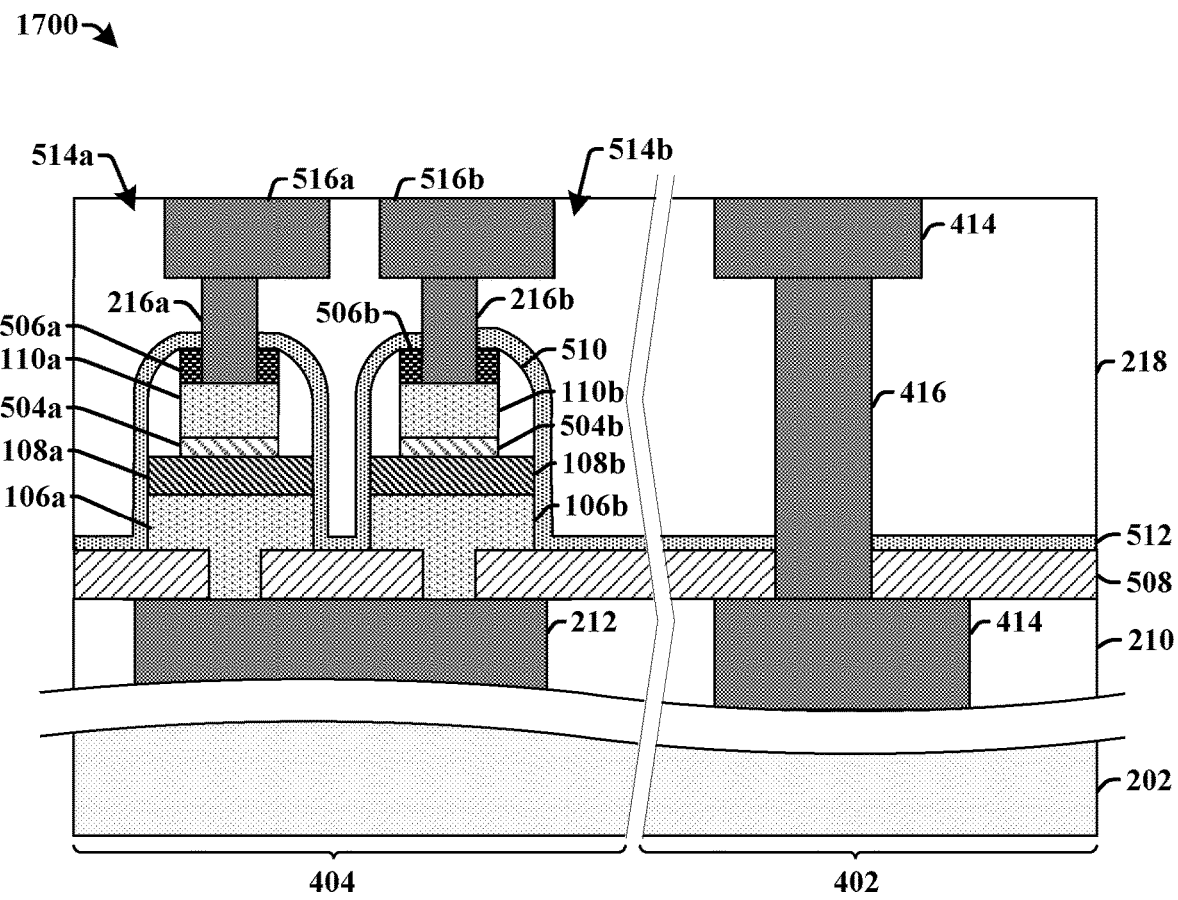

As shown in cross-sectional view 1700 of FIG. 17, upper interconnect structures, 514a and 514b, are formed over the first RRAM element 104a and the second RRAM element 104b. In some embodiments, the upper interconnect structures, 514a and 514b, respectively comprise an upper via, 216a and 216b, and an upper wire, 516a and 516b. In some embodiments, the upper interconnect structures, 514a and 514b, may be formed by etching the upper ILD layer 218 to form a first opening that extends through the upper ILD layer 218 and the first hard mask layer 506a to the first disjunct electrode 110a and to form a second opening that extends through the upper ILD layer 218 and the second hard mask layer 506b to the second disjunct electrode 110b. The openings are then filled with a metal (e.g., copper and/or aluminum) to form the upper via, 216a and 216b, and an upper wire, 516a and 516b.

In some embodiments, a conductive via 416 and a conductive wire 414 may be formed within the logic region 402 concurrent to the formation of the upper interconnect structures, 514a and 514b. The conductive via 416 extends through the upper ILD layer 218, the upper insulating layer 512 and the lower insulating layer 508 to the conductive wire 414.

Figure 18:
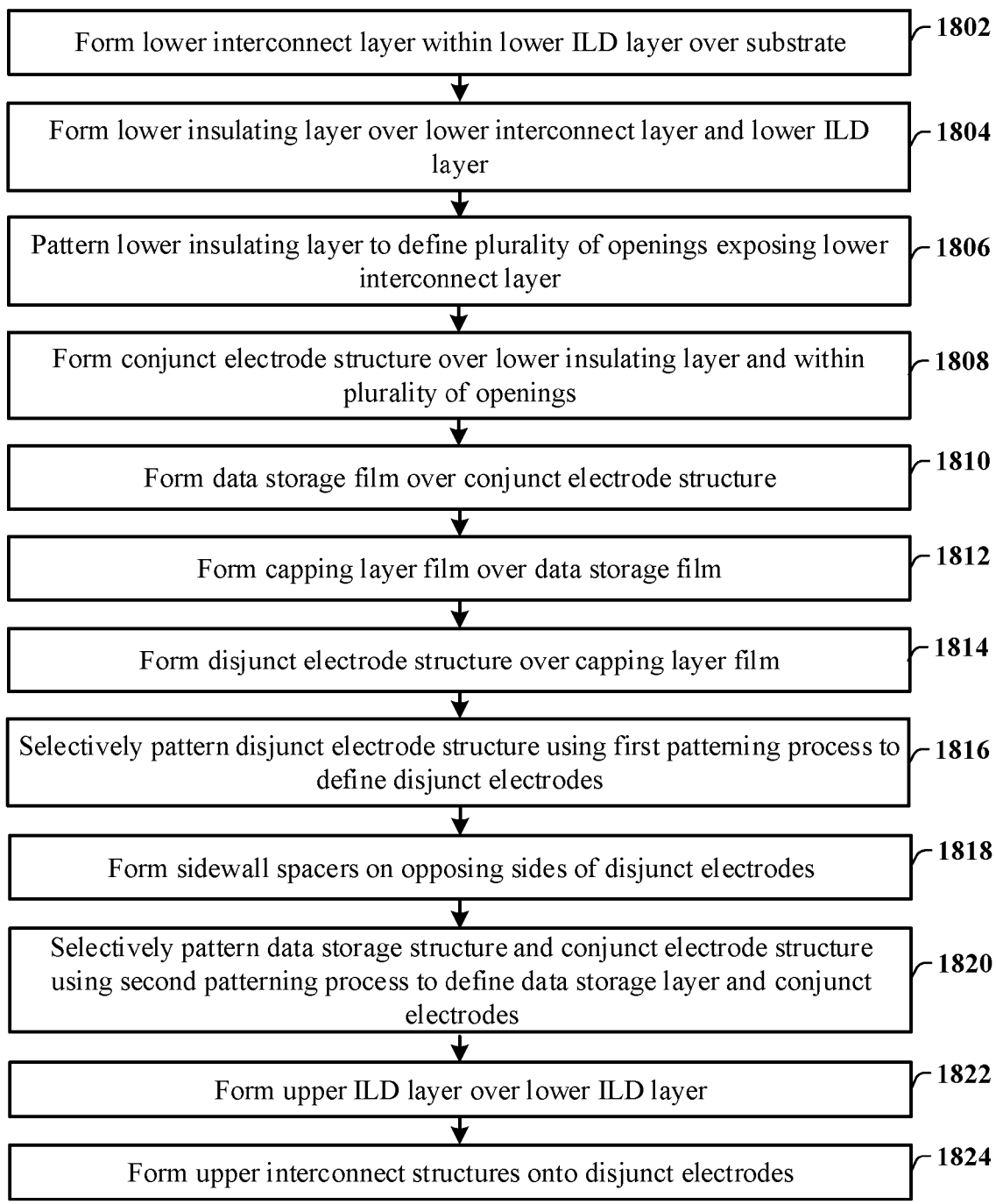
FIG. 18 illustrates a flow diagram of some embodiments of a method of forming an integrated chip comprising a memory circuit having an RRAM cell with multiple RRAM elements.

FIG. 18 illustrates a flow diagram of some embodiments of a method 1800 of forming an integrated chip comprising a memory circuit having an RRAM cell with multiple RRAM elements.

While method 1800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1802, a lower interconnect layer is formed within a lower ILD layer over a substrate. The lower interconnect layer is coupled to a control device within the substrate. FIG. 9 illustrates a cross-sectional view 900 of some embodiments corresponding to act 1802.

At 1804, a lower insulating layer is formed over the lower interconnect layer and the lower ILD layer. FIG. 10 illustrates a cross-sectional view 1000 of some embodiments corresponding to act 1804.

At 1806, the lower insulating layer is patterned to define a plurality of openings exposing the lower interconnect layer. FIG. 10 illustrates a cross-sectional view 1000 of some embodiments corresponding to act 1806.

At 1808, a conjunct electrode structure is formed over the lower insulating layer and within the plurality of openings. FIG. 11 illustrates a cross-sectional view 1100 of some embodiments corresponding to act 1808.

At 1810, a data storage film is formed over the conjunct electrode structure. FIG. 13 illustrates a cross-sectional view 1300 of some embodiments corresponding to act 1810.

At 1812, a capping layer film is formed over the data storage film. FIG. 13 illustrates a cross-sectional view 1300 of some embodiments corresponding to act 1812.

At 1814, a disjunct electrode structure is formed over the capping layer film. FIG. 13 illustrates a cross-sectional view 1300 of some embodiments corresponding to act 1814.

At 1816, the disjunct electrode structure is selectively patterned using a first patterning process to define a plurality of disjunct electrodes. In some embodiments, the first patterning process may further define a plurality of capping layers. FIG. 14 illustrates some embodiments of a cross-sectional view 1400 corresponding to act 1816.

At 1818, sidewall spacers are formed over the data storage film and on opposing sides of the plurality of disjunct electrodes. FIG. 14 illustrates some embodiments of a cross-sectional view 1400 corresponding to act 1818.

At 1820, the data storage film and conjunct electrode structure are selectively patterned using a second patterning process to define a data storage layer and a plurality of conjunct electrodes. FIG. 15 illustrates some embodiments of a cross-sectional view 1500 corresponding to act 1820.

At 1822, an upper inter-level dielectric (ILD) layer is formed over the lower ILD layer. FIG. 16 illustrates some embodiments of a cross-sectional view 1600 corresponding to act 1822.

At 1824, upper interconnect structures are formed onto the plurality of disjunct electrodes. FIG. 17 illustrates some embodiments of a cross-sectional view 1700 corresponding to act 1824.

Therefore, the present disclosure relates to a RRAM circuit having a RRAM cell comprising multiple RRAM elements respectively configured to form a conductive filament. By using multiple RRAM elements to form separate conductive filaments, the RRAM cell is able to overcome performance degradation due to a limited resistance of a single conductive filament.

In some embodiments, the present disclosure relates to a memory circuit. The memory circuit includes a first resistive random access memory (RRAM) element arranged within a dielectric structure over a substrate and having a first conjunct electrode separated from a first disjunct electrode by a first data storage layer; a second RRAM element arranged within the dielectric structure and having a second conjunct electrode separated from a second disjunct electrode by a second data storage layer; and a control device disposed within the substrate and having first terminal coupled to the first conjunct electrode and the second conjunct electrode and a second terminal coupled to a word-line. In some embodiments, the first data storage layer and the second data storage layer are configured to collectively store a single data state. In some embodiments, the first conjunct electrode and the second conjunct electrode are a shared electrode continuously extending from directly below the first data storage layer to directly below the second data storage layer. In some embodiments, the first conjunct electrode is coupled to the second conjunct electrode by a lower interconnect layer disposed within the dielectric structure at a location between the first conjunct electrode and the control device. In some embodiments, the first conjunct electrode is coupled to the second conjunct electrode by a lower interconnect layer continuously extending from directly below the first data storage layer to directly below the second data storage layer. In some embodiments, the first conjunct electrode and the second conjunct electrode are coupled to a same source-line. In some embodiments, the first disjunct electrode is coupled to a first bit-line and the second disjunct electrode is coupled to a second bit-line different than the first bit-line. In some embodiments, the control device comprises a transistor device having a source region coupled to a source-line, a gate electrode coupled to the word-line, and a drain region electrically coupled to the first conjunct electrode and the second conjunct electrode. In some embodiments, the first data storage layer and the second data storage layer have a variable resistance.

In other embodiments, the present disclosure relates to a memory circuit. The memory circuit includes a first resistive random access memory (RRAM) element arranged within a dielectric structure over a substrate and having a first conjunct electrode separated from a first disjunct electrode by a first data storage layer; a second RRAM element arranged within the dielectric structure and having a second conjunct electrode separated from a second disjunct electrode by a second data storage layer; and a conductive element continuously extending from directly below the first data storage layer to directly below the second data storage layer, wherein the conductive element is configured to electrically couple the first conjunct electrode to the second conjunct electrode. In some embodiments, the first data storage layer has a first outermost sidewall that is separated from a second outermost sidewall of the second data storage layer by a non-zero distance. In some embodiments, the first data storage layer and the second data storage layer are configured to collectively store a single data state. In some embodiments, the first conjunct electrode and the second conjunct electrode comprise a first material; and the conductive element comprises a second material that is different than the first material. In some embodiments, the memory circuit further includes a transistor device disposed within the substrate and having a drain region electrically coupled to the first conjunct electrode and the second conjunct electrode. In some embodiments, the first conjunct electrode is coupled to the second conjunct electrode by a lower interconnect layer between the first conjunct electrode and the transistor device. In some embodiments, the first disjunct electrode is coupled to a first bit-line and the second disjunct electrode is coupled to a second bit-line that is different than the first bit-line. In some embodiments, the memory circuit further includes sidewall spacers arranged between the first disjunct electrode and the second disjunct electrode.

In yet other embodiments, the present disclosure relates to a method of forming a memory circuit. The method includes forming a lower interconnect layer within a lower inter-level dielectric (ILD) layer over a substrate; forming a conjunct electrode structure over the lower interconnect layer; forming a data storage film over the conjunct electrode structure; forming an disjunct electrode structure over the data storage film; and patterning the data storage film, the disjunct electrode structure, and the conjunct electrode structure to form a first data storage layer between the lower interconnect layer and a first disjunct electrode and to form a second data storage layer between the lower interconnect layer and a second disjunct electrode. In some embodiments, the disjunct electrode structure is patterned by a first patterning process and the data storage film and the conjunct electrode structure are patterned by a second patterning process that occurs after the first patterning process. In some embodiments, the method further includes forming a lower insulating layer over the lower ILD layer; patterning the lower insulating layer to form a plurality of openings exposing the lower interconnect layer; and forming the conjunct electrode structure to fill the openings and extend over the lower insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. For example, although the disclosure describes the oxygen barrier layer as being within a multi-layer disjunct electrode, it will be appreciated that the oxygen barrier layer is not limited to the disjunct electrode. Rather, the oxygen barrier layer may also or alternatively be present in a multi-layer conjunct electrode.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
    a first resistive random access memory (RRAM) element and a second RRAM element over a substrate;
    a conductive element arranged below the first RRAM element and the second RRAM element, wherein the conductive element electrically couples the first RRAM element to the second RRAM element;
    an upper insulating layer continuously extending over the first RRAM element and the second RRAM element; and
    an upper inter-level dielectric (ILD) structure laterally surrounding the first RRAM element and the second RRAM element, wherein the upper insulating layer separates the first RRAM element and the second RRAM element from the upper ILD structure.

2. The integrated chip of claim 1, wherein the upper insulating layer laterally separates a sidewall of the first RRAM element from a sidewall of the upper ILD structure.

3. The integrated chip of claim 1, wherein the upper ILD structure comprises a part that is laterally between the first RRAM element and the second RRAM element, the part of the upper ILD structure extending from vertically above a top of the upper insulating layer to vertically below the top of the upper insulating layer.

4. The integrated chip of claim 1, wherein the upper insulating layer has an upper surface laterally between the first RRAM element and the second RRAM element, the upper surface being vertically between a top of the first RRAM element and a bottom of the first RRAM element.

5. The integrated chip of claim 1, wherein the upper insulating layer has a first upper surface along a first side of the first RRAM element and a second upper surface along an opposing second side of the first RRAM element, the first upper surface being vertically offset from the second upper surface by a non-zero distance.

6. The integrated chip of claim 1, wherein the upper insulating layer has a first upper surface along a first side of the first RRAM element and a second upper surface along an opposing second side of the first RRAM element, the first upper surface having a larger width than the second upper surface.

7. The integrated chip of claim 1, wherein the upper insulating layer has a first upper surface that extends outward from a first sidewall disposed along a first side of the first RRAM element facing the second RRAM element and a second upper surface that extends outward from a second sidewall disposed along a second side of the first RRAM element facing away from the second RRAM element, the first upper surface being vertically above the second upper surface.

8. The integrated chip of claim 1, wherein the first RRAM element comprises a first data storage layer disposed between a lower electrode and an upper electrode, the lower electrode laterally extending between opposing outermost sidewalls of the first data storage layer.

9. An integrated chip, comprising:
a lower interconnect disposed over a substrate;
one or more lower electrodes disposed on the lower interconnect and partially surrounded by a lower insulating structure;
a first data storage structure contacting the one or more lower electrodes over a top of the lower insulating structure; and
a second data storage structure contacting the one or more lower electrodes over the top of the lower insulating structure.

10. The integrated chip of claim 9, wherein the top of the lower insulating structure is directly below one or more of the first data storage structure and the second data storage structure.

11. The integrated chip of claim 9, wherein the lower insulating structure is over the lower interconnect.

12. The integrated chip of claim 11, wherein the lower insulating structure continuously extends from directly below the first data storage structure to directly below the second data storage structure.

13. The integrated chip of claim 9, further comprising:
an upper inter-level dielectric (ILD) structure disposed over the lower insulating structure and laterally between sidewalls of the first data storage structure and the second data storage structure.

14. The integrated chip of claim 9, further comprising:
a first upper electrode disposed on the first data storage structure; and
a first upper interconnect contacting an upper surface of the first upper electrode, wherein the first upper electrode laterally extends past an outermost sidewall of the first upper interconnect.

15. The integrated chip of claim 9, wherein the lower insulating structure has a first upper surface along a first side of the first data storage structure and a second upper surface along an opposing second side of the first data storage structure, the first upper surface having a larger width than the second upper surface.

16. An integrated chip, comprising:
a lower interconnect disposed over a substrate;
one or more lower electrodes disposed over the lower interconnect, wherein the one or more lower electrodes respectively comprise a lower sidewall and an upper sidewall over a top of the lower sidewall;
a first data storage structure arranged on the one or more lower electrodes;
a second data storage structure arranged on the one or more lower electrodes and laterally separated from the first data storage structure; and
wherein the lower interconnect continuously extends from directly below the first data storage structure to directly below the second data storage structure.

17. The integrated chip of claim 16, wherein the lower interconnect comprises a top surface that continuously extends from directly below the first data storage structure to directly below the second data storage structure.

18. The integrated chip of claim 16, further comprising:
a second lower interconnect laterally separated from the lower interconnect by an inter-level dielectric (ILD) layer; and
a via structure contacting the second lower interconnect, the via structure vertically extending from the second lower interconnect to above a top of the first data storage structure.

19. The integrated chip of claim 16, further comprising:
a first upper electrode contacting the first data storage structure, wherein the first upper electrode has a smaller width than a top of the one or more lower electrodes.

20. The integrated chip of claim 16, wherein a top of the lower interconnect has a greater width than a bottom of the one or more lower electrodes.

* * * * *